United States Patent
Slayton

(10) Patent No.: US 7,940,879 B2
(45) Date of Patent: May 10, 2011

(54) METHOD AND SYSTEM OF DETECTING AND LOCKING TO MULTI-STANDARD VIDEO STREAMS

(75) Inventor: Gary E. Slayton, Pear Blossom, CA (US)

(73) Assignee: Aptina Imaging Corporation, George Town (KY)

( * ) Notice: Subject to any disclaimer, the term of this patent is extended or adjusted under 35 U.S.C. 154(b) by 723 days.

(21) Appl. No.: 11/871,622

(22) Filed: Oct. 12, 2007

(65) Prior Publication Data
US 2009/0097607 A1    Apr. 16, 2009

(51) Int. Cl.
H03D 3/24    (2006.01)
(52) U.S. Cl. ......................................................... 375/376
(58) Field of Classification Search .................. 375/215, 375/294, 327, 354, 357, 369, 372, 373, 374, 375/376; 370/395.62, 507, 503; 455/265, 455/180.3, 266; 702/89; 713/375, 400; 342/103; 327/141, 146, 147, 148, 149, 150, 156, 157, 327/158, 159
See application file for complete search history.

(56) References Cited

U.S. PATENT DOCUMENTS

| | | | |
|---|---|---|---|
| 5,111,160 A * | 5/1992 | Hershberger | 331/1 A |
| 5,727,019 A | 3/1998 | Tatsumi | |
| 5,825,253 A | 10/1998 | Mathe et al. | |
| 6,108,046 A | 8/2000 | Wu et al. | |
| 7,042,972 B2 | 5/2006 | Fahim | |
| 7,046,098 B2 | 5/2006 | Staszewski | |
| 7,064,617 B2 | 6/2006 | Hein et al. | |
| 7,200,364 B2 | 4/2007 | Lim et al. | |
| 7,663,416 B2 * | 2/2010 | Tung et al. | 327/156 |
| 2006/0267693 A1 | 11/2006 | Buell | |
| 2007/0066268 A1 | 3/2007 | Simic et al. | |
| 2008/0269928 A1 * | 10/2008 | May | 700/94 |
| 2008/0298532 A1 * | 12/2008 | Wang | 375/376 |

OTHER PUBLICATIONS

Vectron International, "Frequency Control, Sensor, and Hybrid Product Solutions, Clock and Data Recover Products," 1997-2007; 3 pages.

* cited by examiner

Primary Examiner — Sam K Ahn

(57) ABSTRACT

A video processing system includes a video detection circuit for determining the clock frequency of an incoming video signal. Using the determined clock frequency, adjustments are made in a phase lock loop to enable a quick lock onto the clock frequency of the incoming video signal.

23 Claims, 5 Drawing Sheets

METHOD AND SYSTEM OF DETECTING AND LOCKING TO MULTI-STANDARD VIDEO STREAMS

FIELD OF THE INVENTION

Embodiments of the invention generally relate to video imaging processing and more specifically to methods and systems for locking to the frequency of an incoming video stream.

BACKGROUND OF THE INVENTION

Video imaging systems have many different signal formats. Generally, each such video format has a reliable, unique set of frequencies for decoding and/or displaying the video signals. For example, most broadcast television video systems in the U.S. employ the NTSC format. Other countries use the PAL format The NTSC format uses a frame frequency of 29.97 Hz (interlaced frames of video per second) while the PAL format uses 25 Hz. For 29.97 Hz NTSC, having 525 total scan lines having 486 visible scan lines, with a 4:3 aspect ratio, the clock frequency of the video signal is 13.5 MHz. For 25 Hz PAL, having 625 total scan lines, with a 4:3 aspect ratio, the clock frequency is 13.5 MHz.

Video recording playback and other broadcast equipment may also employ one of a number of different video signal formats. The video clock frequency for a video signal can be derived from synchronizing signals that accompany the video frames. Video signals have horizontal and vertical synchronizing (sync) signals or pulses that respectively indicate the end of a line of an image and the end of an image frame. In conventional systems which receive and process a video signal, a phase locked loop (PLL) system compares an incoming video signal to a reference signal and attempts to determine and lock to the appropriate video clock frequency and provide a stable output signal for use in processing the video signal. If an incoming video signal can be one of a plurality of possible video formats effort and time are required by the receiving circuits to determine the video format, so that processing circuitry can be suitably adjusted. As conventional systems attempt to determine and lock in on the appropriate clock frequency, the spectral purity of the resulting output clock signal which is used in the processing of the incoming video signal is impacted in that clock jitter occurs. Jitter is the oscillation of the output clock signal about a desired output frequency which occurs as the system searches for and locks onto the clock frequency of the incoming signal. There is a direct correlation between the possible range of input video signal clock frequencies, the range of the video signal output frequency and the jitter. The greater the frequency difference in a number of possible clock frequencies for incoming video formats which a receiving circuit must be able to lock to, the greater the likelihood and significance of clock jitter. Therefore, it is desirable to minimize the amount of output clock frequency jitter which occurs during detection and locking to the clock frequency of the incoming video signal.

DETAILED DESCRIPTION OF THE INVENTION

In the following detailed description, reference is made to the accompanying drawings, which form a part hereof, and in which is shown by way of illustration specific embodiments that may be practiced. These embodiments are described in sufficient detail to enable those of ordinary skill in the art to make and use the invention. It should be understood that structural, logical, or procedural changes may be made to the specific embodiments disclosed without departing from the spirit or scope of the invention.

Figure 1:
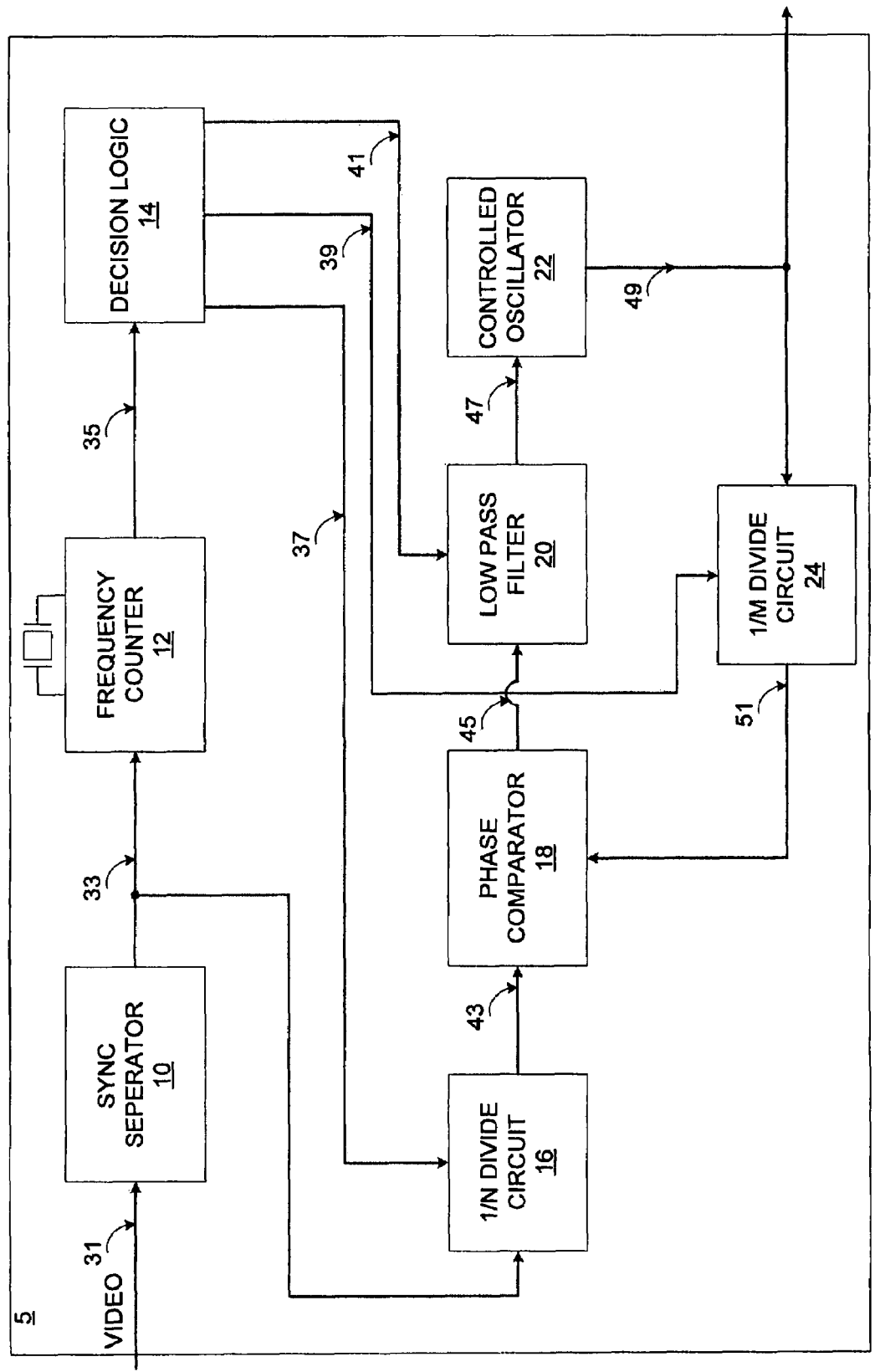
FIG. 1 is a block diagram of a video detection circuit in accordance with an example embodiment described herein.

FIG. 1 shows a video detection circuit 5 in accordance with a first embodiment. As seen in FIG. 1, video detection circuit 5 includes synchronization (sync) separator circuit 10, frequency counter circuit 12, decision logic circuit 14, a 1/N divide circuit 16, a phase comparator circuit 18, a low pass filter 20, a controlled oscillator circuit 22, and a 1/M divide circuit 24. Circuits 10, 16, 18, 20, 22, 24 are arranged as a phase lock loop (PLL) which supplies an output frequency on line 49.

As will be described below, video detection circuit 5 minimizes the amount of jitter that occurs in the voltage controlled oscillator ("VCO") by quickly narrowing the range of operation of the phase lock loop as it attempts to lock onto the frequency of the incoming video signal on line 31. In an analog implementation of detection circuit 5, the controlled oscillator 22 is typically a Voltage Controlled Oscillator. In a digital device, the controlled oscillator is typically a Digitally Controlled Oscillator ("DCO").

The FIG. 1 phase lock loop circuit provides a clock signal output on line 49 which is locked in frequency and phase to the frequency and phase of the clock frequency of an incoming video signal on line 31. A detected vertical sync signal is used to determine the clock frequency of an incoming video stream and to set a clock frequency for use in processing said video signal. Synchronization separator circuit 10 receives video signals from an incoming video signal as an input on line 31 and separates the video sync signals from the video signals and provides the video sync signals as an output on line 33.

Frequency counter circuit 12 receives the video sync signals as input on line 33, determines the clock frequency of the incoming video signal and provides an indication of the clock frequency of the incoming video signal as an output on line 35. Frequency counter circuit 12 is described in greater detail below with respect to FIG. 2.

Decision logic circuit 14 receives the information concerning the frequency of the incoming video signal as an input on line 35 and determines the appropriate settings for divide circuits 16, 24 and low pass filter 20 that correspond to the detected frequency to enable the phase lock loop circuit to operate in a lock range around the detected incoming frequency. For frequency divider circuits 16, 24, an integer value is provided. (N for divide circuit 16, M for divide circuit 24). Similarly, a control signal is provided by decision logic 14 to low pass filter 20 indicating what low pass filters should be applied based on the detected video frequency. In one embodiment, the decision logic circuit 14 uses a look-up table to determine divider and filter settings that correspond to the incoming video frequency. In another aspect, the decision logic circuit 14 comprises a logic circuit which determines the settings for divide circuits 16, 24 and low pass filter 20.

The decision logic circuit 14 sets values for divide circuits 16, 24 and low pass filter 20 which will ensure a quick lock on to the video sync signal detected by the sync separator 10. As but one non limiting example, if the incoming video stream is in accordance with one of NTSC or PAL formats, once the frequency counter 12 determines which format is present, the phase lock loop formed by 1/N divide circuit 16, phase comparator 18, low pass filter 20, controlled oscillator 22, 1/M divide circuit 24 is adjusted based on the detected sync signal, enabling controlled oscillator 22 to provide a clock signal with less jitter as the phase lock loop locks to the frequency of the incoming video signal.

As noted, decision logic circuit 14 determines two divider values for the PHASE LOCK LOOP: N and M that correspond to the detected video format. The 1/N and 1/M divide circuits are programmable dividers that can implement 1/integer division. The values N and M are likely to be different values, but they could be the same. The N divisor value is provided to divide circuit 16 as an output on line 37 and the M divisor value is provided to divide circuit 24 as an output on line 39.

For example, for a video signal of 29.97 Hz, 525 lines of resolution, 4:3 aspect ratio NTSC, a pixel clock is 13.5 MHz. 29.97 Hz can be approximated to 30 Hz; thus, the required divider would be 13,500,000 Hz/30 hz=450,000. Thus M would be 450,00 for the 1/M divide circuit 24 and N would be 1. In another example, for a video signal of 25 MHz, 525 lines of resolution, 4:3 aspect ratio PAL, the pixel clock can be 13.5 MHz, the divider needed would be 13,500,000 Hz/25 hz=540,000. Thus M would be 540,00 for the 1/M divide circuit 24 and N would be 1. Decision logic circuit 14 determines the low pass filter that corresponds to the determined frequency and outputs the filter value setting on line 41.

Divide circuit 16 is a 1/N divide circuit that receives video sync signals from line 33 and an N divider value on line 37. Divide circuit 16 divides the video sync signal by the N value and provides the result as an output on line 43 to phase comparator 18.

Divide circuit 24 is a 1/M divide circuit that receives controlled oscillator signals over line 49 and an M divider value on line 39. Divide circuit 24 divides the controlled oscillator signals by the M value and provides the result as an output on line 51 to phase comparator 18.

The phase comparator circuit 18 compares the divided video sync signal input on line 43 with the divided controlled oscillator signal input on line 51 and determines whether there is a difference in phase between the two signals. The phase compare circuit 18 outputs a signal on line 45 indicating the difference in phase (if any).

Low pass filter 20 receives the phase difference signal over line 45 and a filter designation on line 41 and performs a low pass filtering of the output of phase comparator 18 and provides a control signal to the control oscillator circuit 22 on line 47.

In response to the control signal on line 47, the controlled oscillator circuit 22 either maintains the current frequency and/or phase or changes frequency and/or phase based on the control signal. The output signal from oscillator 22 is provided to divide circuit 24 and is also provided as an output video stream clock signal to downstream video processing circuits (not shown).

The video detection circuit of FIG. 1 video by quickly adapting the phase lock loop in response to a detected imaging video signal clock frequency provides a narrow range of phase lock loop operation to achieve a faster lock on the video sync signal one line 33. Accordingly, the search and lock can be executed more quickly and with reduced jitter on the output clock signal on line 49.

Figure 2:
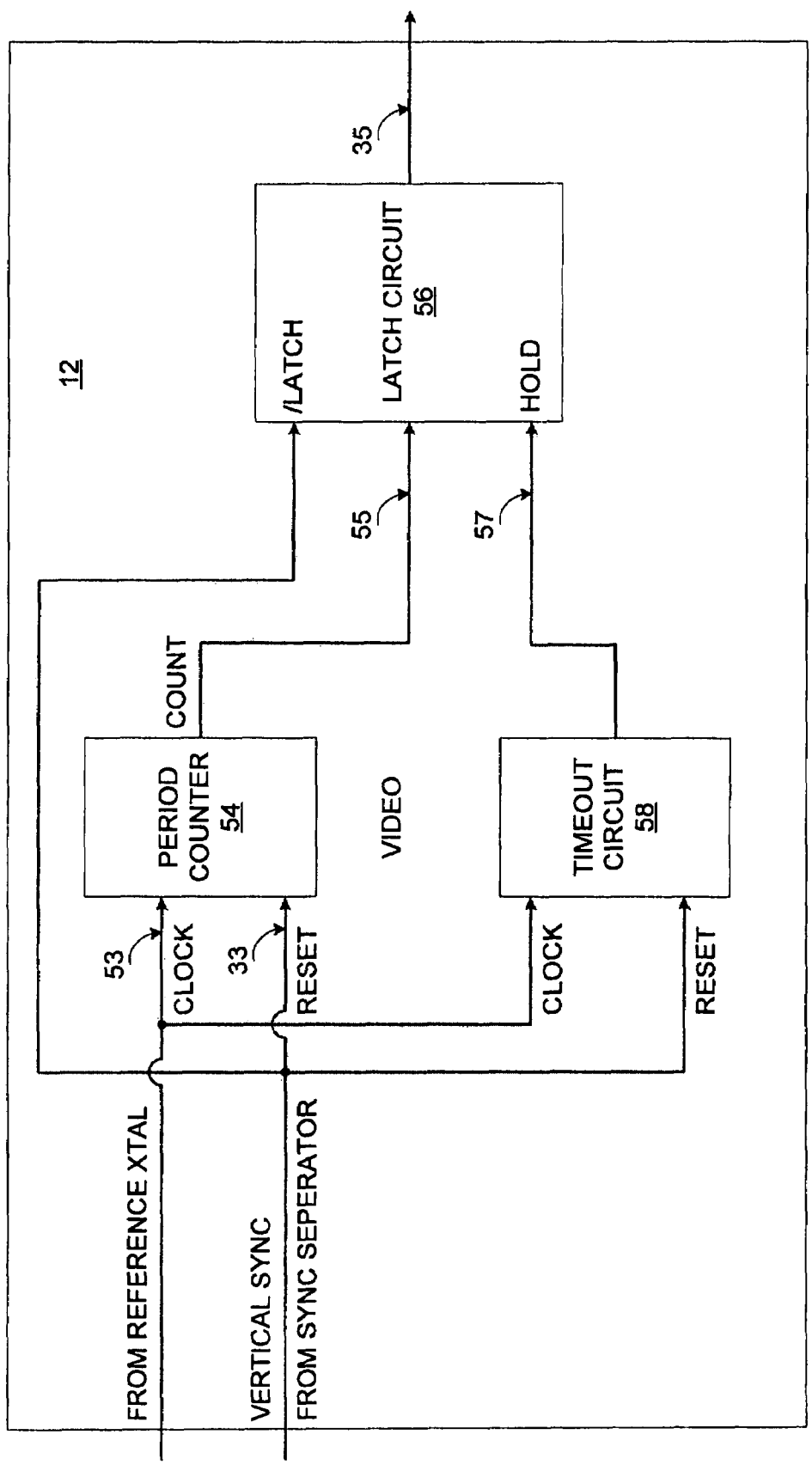
FIG. 2 depicts an embodiment of frequency counter that can be used in the FIG. 1 circuit.

FIG. 2 illustrates an embodiment of the frequency counter 12 of FIG. 1. Frequency counter 12 includes a period counter circuit 54, a hold circuit 56, and a timeout circuit 58. The frequency counter 12 must be able to maintain the last known good frequency count in order to provide the most accurate signal indicating a detected sync signal frequency to the decision logic circuit 14. This prevents the output clock signal on line 49 from being reduced to a minimum frequency when an input video signal is not present. The frequency counter 12 uses the falling edge of the vertical sync signal to latch, update, and reset the period count which is supplied to the decision logic circuit 14 prior to restarting the period count. The frequency counter 12 inputs vertical sync signals on line 33 and a reference clock signal on line 53. The frequency counter 12 provides the count of the frequency of the reference clock signal that corresponds to the period of the vertical sync signal as an output on line 35.

Period counter circuit 54 counts the reference clock signals in between the reset signals it receives as the detected vertical sync signals on line 33. Shortly before resetting the count of counter 54, the circuit 54 provides the count to the latch circuit 56 on line 55.

Timeout circuit 58 compares the difference in time between the clock signals received on line 53 and the consecutive reset signals received on line 33. If the time difference is greater than a pre-determined value, then a reset signal on line 33 has been missed and the count calculated in period counter 54 is incorrect. If the count is incorrect, the timeout circuit 58 outputs a hold signal to the latch circuit 56 on line 57 indicating that latch circuit 56 should maintain the last count value received from period counter 54. If the count in counter 54 is correct, that is, no reset signal on line 33 has been missed, the timeout circuit 58 does not output a hold signal to the hold circuit 56 on line 57.

Latch circuit 56 holds the count received from period counter 54 and provides the held value as an output. When the latch circuit 56 receives a latch signal on line 33 and does not receive a hold signal on line 57, the latch circuit 56 stores the current count currently provided by the period counter 54 on line 55. When the latch circuit 56 receives a latch signal on line 33 and also receives a hold signal on line 57, the latch circuit 56 does not reset; instead, it maintains a previous count provided by the period counter 54 on line 55.

Figure 3:
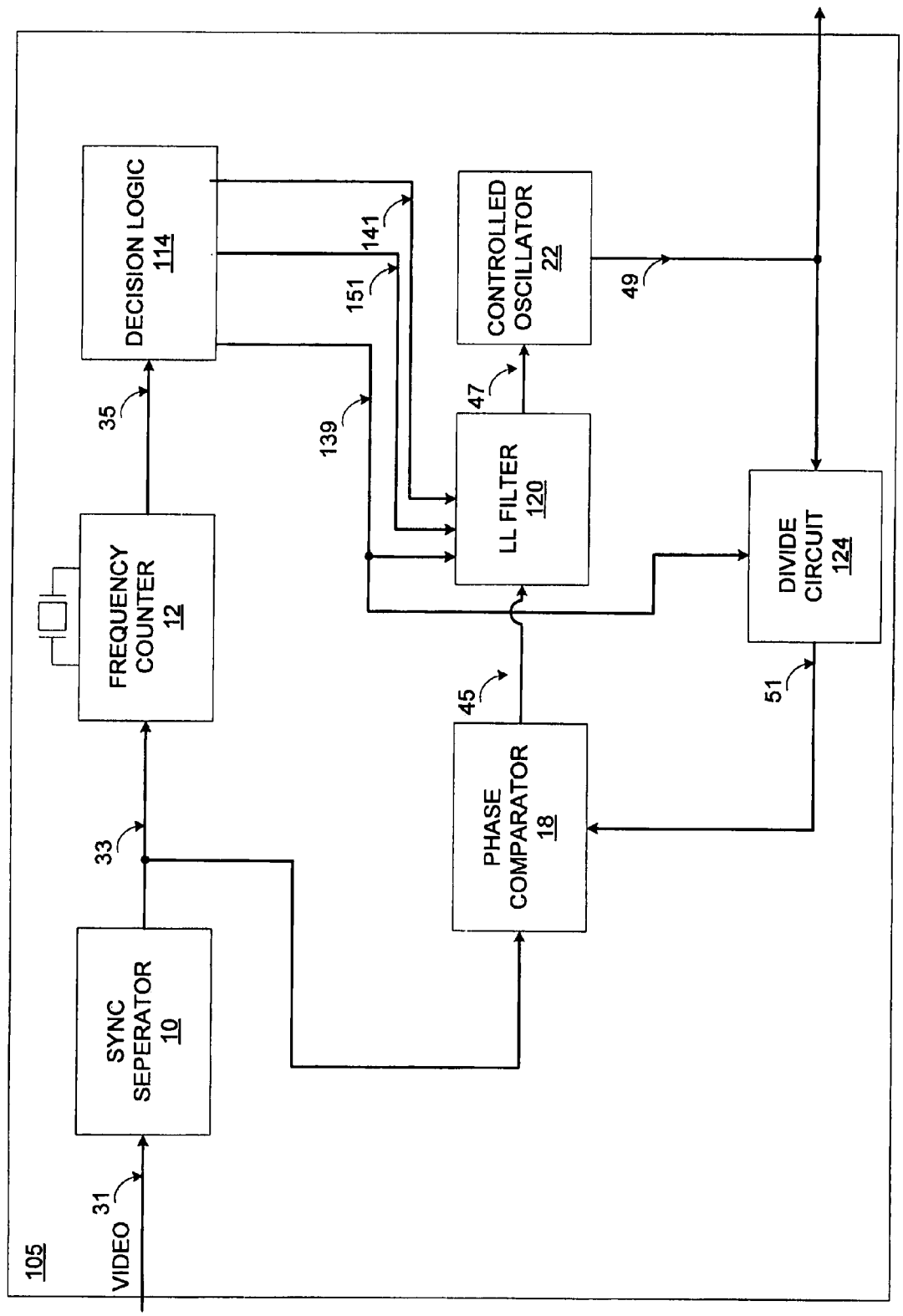
FIG. 3 is a block diagram of a video detection circuit in accordance with another embodiment described herein.

While the FIG. 1 embodiment can be used with different video signal formats, including NTSC and PAL, and other video recording and broadcast formats, FIG. 3 illustrates another embodiment tailored more specifically to NTSC and PAL systems. Video detection circuit 105 is similar to video detection circuit 5, but since it is specifically designed for use in PAL and NTSC systems does not include the 1/N divide circuit 16 used in video detection circuit 5. The video detection circuit 105 includes a lead/lag (LL) filter 120 rather than the low pass filter 20 of video detection circuit 5. Additionally, the decision logic circuit 114 and the divide circuit 124 are different from the decision logic circuit 14 and the divide circuit 24 of video detection circuit 5 due to some differences in the video detection circuit 105 (as discussed below).

Divide circuit 124 receives two inputs: the output of the decision logic circuit 114 on line 139 and the output of the controlled oscillator 22 on line 49. As described below, the output from decision logic circuit 114 is binary indication of whether the signal is a PAL video signal, where one of the two possible alternatives indicates TRUE and the other alternative indicates FALSE. If the signal indicates that PAL is TRUE, the divide circuit 124 uses 270,000 as a divisor. If the signal indicates that PAL is FALSE, hence, the signal is an NTSC signal, the divide circuit 124 uses 235,000 as a divisor. Thus, the divide circuit 124 divides the signal received from controlled oscillator 22 on line 49 by the divisor based on the PAL signal and outputs the result on line 51.

Figure 4:
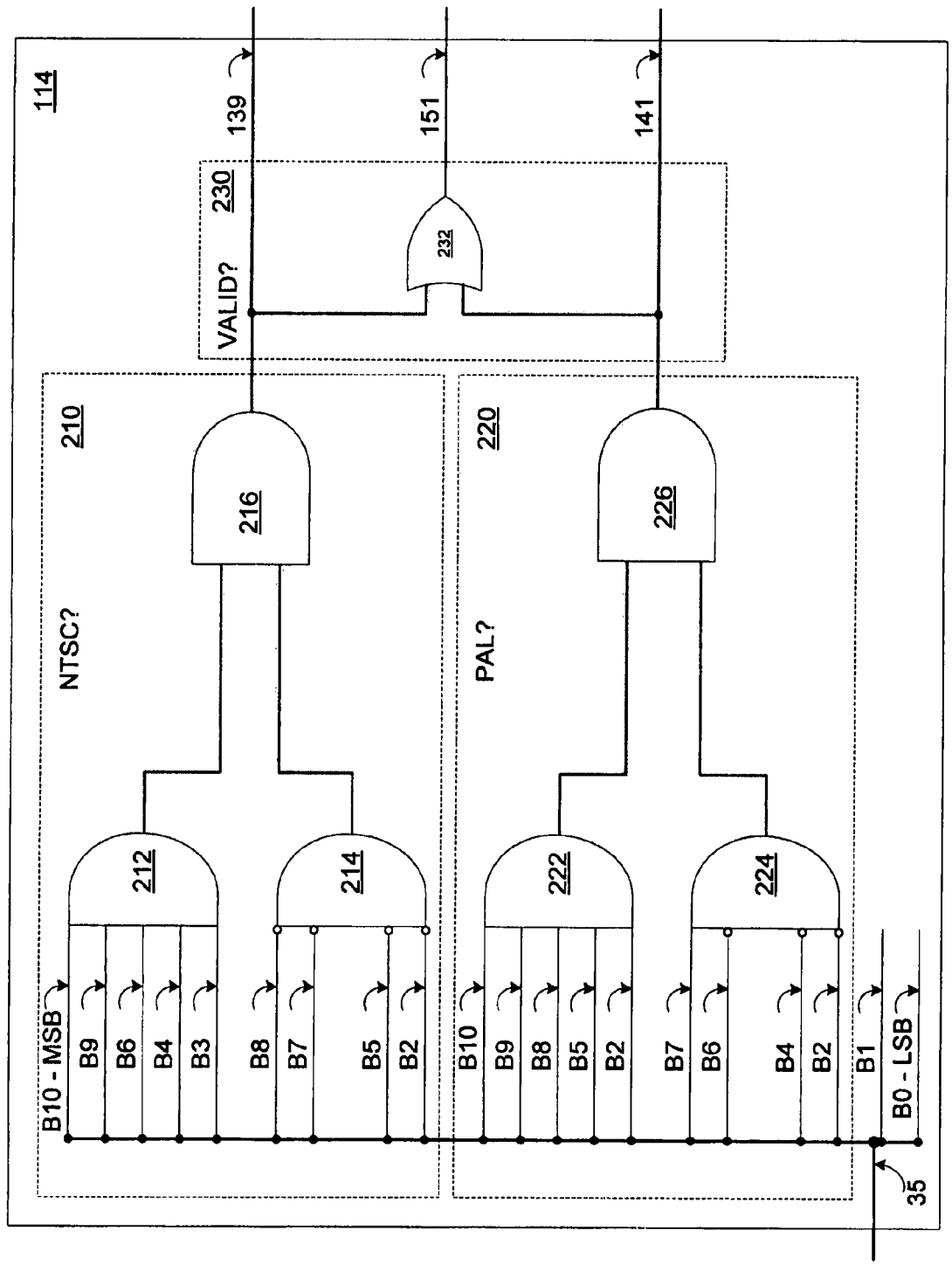
FIG. 4 depicts an embodiment of a decision logic circuit that can be used in the FIG. 3 detection circuit.

FIG. 4 shows an embodiment of the decision logic circuit 114 of FIG. 3. In the illustrated embodiment, the frequency counter 12 (FIG. 3) provides an eleven bit count signal, i.e., bits 0-10, where bit 0 ("B0") is the least significant bit and bit 10 ("B10") is the most significant bit. Using the eleven bit count signal, decision logic circuit 114 attempts to determine whether the video signal is a PAL or an NTSC signal. Circuit 210 determines if the count signal corresponds to an NTSC signal, e.g., whether the count signal is equivalent to the value 1624, by comparing several of the bit data lines from latch 56 of the frequency counter 12. As seen in FIG. 4, AND circuit 212 AND's bits 10, 9, 6, 4, and 3 together, (i.e., bits B10, B9, B6, B4, B3). AND circuit 214 AND's the inverse of bits 8, 7, 5, and 2 together, (i.e., bits B8, B7, B5, and B2). AND circuit 216 AND's the results from the outputs of AND circuit 212 and AND circuit 214. If the output of circuit AND 216 is TRUE, then the signal count value was equivalent to the value 1624, and the value output on line 139 is TRUE, meaning that the video signal is an NTSC video signal.

Circuit 220 determines if the video signal is a PAL signal, e.g., whether the count signal is equivalent to the value 1960, by comparing several of the bit data lines. As seen in FIG. 4, AND circuit 222 AND's bits 10, 9, 8, 5, and 2 (i.e., bits B10, B9, B8, B5, B2) together. AND circuit 224 AND's bit 7 (i.e., bit B7) and the inverse of bits 6, 4, and 2 (i.e., bits B6, B4, and B2) together. AND circuit 226 AND's the results from AND circuit 222 and AND circuit 224. If the output of AND circuit 226 is TRUE, then the count signal value was equivalent to the value 1960, and the value output on line 141 is TRUE, meaning that the video signal is a PAL video signal.

Valid circuit 230 determines if there is a valid signal output from decision logic circuit 114, i.e., whether there is a valid determination of a PAL or a NTSC video signal. Valid circuit 230 compares, by OR'ing together in OR circuit 232, the output from circuits 210 and 220, and if either of the outputs are TRUE, then the valid signal is TRUE and provided on line 151. The output lines 139, 141 supply appropriate control signals to divide circuits 124 and lead lag filter 120, enabling them to be set for a quick phase lock loop lock onto the incoming video signal clock signal represented by the vertical sync on line 33.

Figure 5:
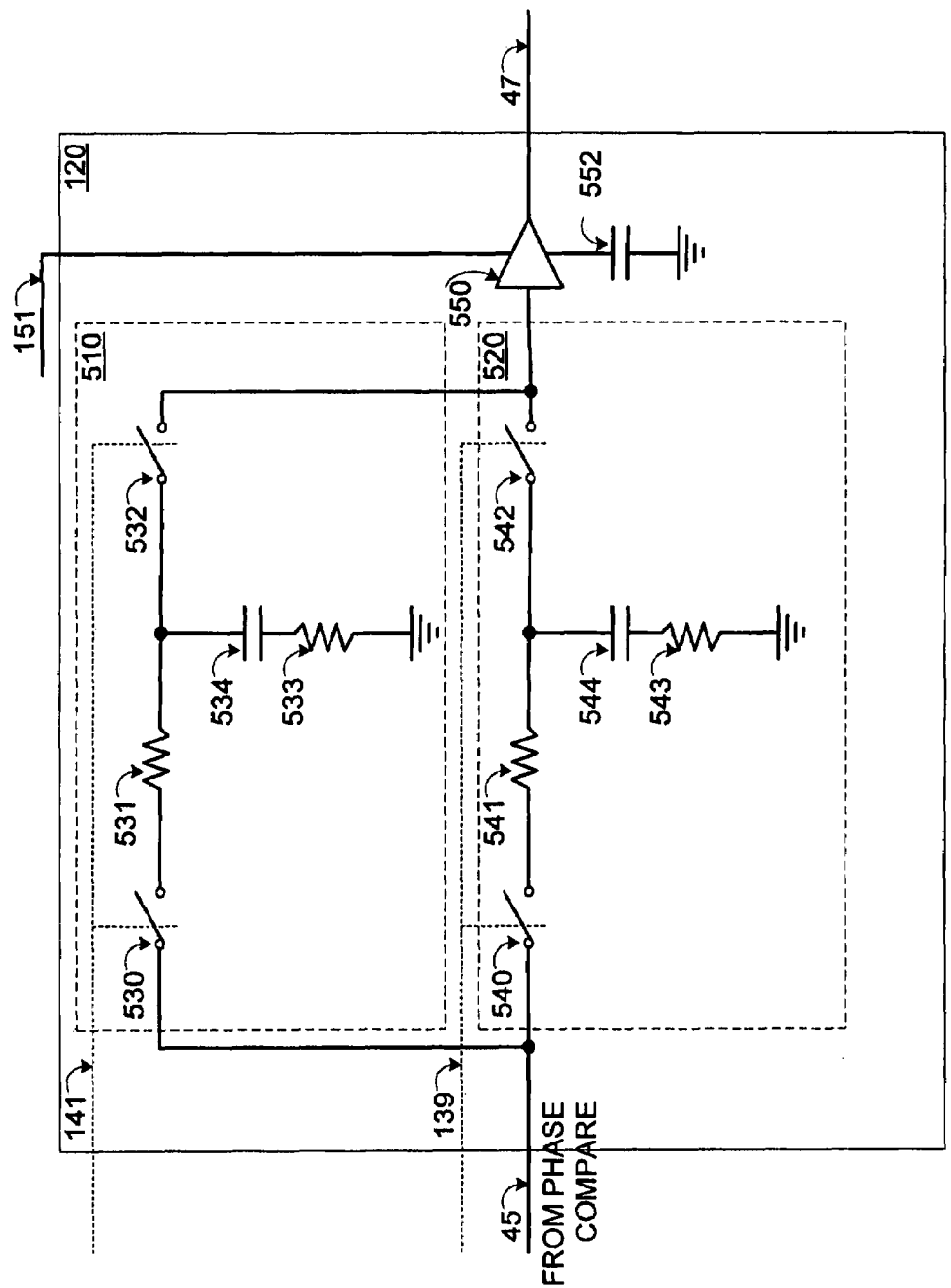
FIG. 5 depicts an embodiment of a lead/lag filter circuit that can be used in the FIG. 3 detection circuit.

FIG. 5 shows an embodiment of the lead/lag filter 120 of FIG. 3, which includes a PAL filter 510 and an NTSC filter 520. If the value on the PAL line 141 is TRUE, then switches 530 and 532 are closed, thereby coupling line 45 to track and hold amplifier 550 through PAL filter 510. As such, the signal received by lead/lag filter 120 on line 45 is modified by the resistors 531, 533 and capacitor 534 in PAL filter 510. The modification of the signal "s" can be determined by a standard LaPlasse transform:

$$F(s) = \frac{(1 + sCR_2)}{(1 + sC(R_1 + R_2))} \quad (1)$$

where C is the capacitance of capacitor 534, R1 is the resistance of the first resistor 531, and R2 is the resistance of the second resistor 533. In one embodiment, the capacitance of capacitor 534 is 0.1 µF, the resistance of the first resistor 531 is 1,200 µohms, and the resistance of the second resistor 533 is 300 µohms.

If the value on the NTSC line 139 is TRUE, then switches 540 and 542 are closed, thereby coupling line 45 to track and hold amplifier 550 through NTSC filter 520. As such, the signal received by lead/lag filter 120 on line 45 is modified by the resistors 541, 543 and capacitor 544 in NTSC filter 520. The modification of the signal "s" can be determined by equation 1 above, where C is the capacitance of capacitor 544, R1 is the resistance of the first resistor 541, and R2 is the resistance of the second resistor 543. In one embodiment, the capacitance of capacitor 544 is 0.1 µF, the resistance of the first resistor 541 is 1,000 µohms, and the resistance of the second resistor 543 is 310 µohms.

Track and hold amplifier 550 receives the signal provided by either the PAL filter 510 or the NTSC filter 520 and if the Valid signal from line 151 is TRUE, amplifies the filtered phase compared signal and provides it as output on line 47. If the Valid signal from line 151 is TRUE, amplifies the filtered phase compared signal and provides it as output on line 47.

Thus, the video detection circuit of FIGS. 3, 4, and 5 effectively predetermines a range of operation of the phase lock loop. By narrowing the range of operation, the search for a video signal frequency can be executed more quickly and with reduced jitter.

While the embodiments have been described and illustrated with reference to specific embodiments, it should be understood that many modifications and substitutions could be made without departing from the spirit and scope of the claimed invention. Accordingly, the claimed invention is not to be considered as limited by the foregoing description but is only limited by the scope of the claims.

What is claimed as new and desired to be protected by Letters Patent of the United States is:

1. A video processing circuit comprising:
    an incoming video circuit for receiving an incoming video signal;
    a phase lock loop circuit for receiving a signal representing the frequency of said incoming video signal and providing an output signal related to the frequency of said incoming video signal; and
    a determining and setting circuit for determining a clock frequency of said incoming video signal and responsive thereto for determining and setting operating parameters for said phase lock loop circuit, wherein said determining and setting circuit further comprises:
        a frequency counter circuit for determining the clock frequency of the incoming video signal, said frequency counter circuit coupled to said incoming video circuit.

2. The video processing circuit of claim 1, wherein said determining and setting circuit further comprises:
    a decision logic circuit, coupled to and configured to receive input from said frequency counter circuit, configured to determine filter parameters for a filter circuit in said phase lock loop circuit.

3. The video processing circuit of claim 2, wherein said decision logic circuit is configured to determine a divider value for at least one divider provided in said phase lock loop circuit.

4. The video processing circuit of claim 2, wherein said phase lock loop circuit comprises:
    a phase comparator circuit for comparing two incoming signals and proving an output indicating the results of said comparison; and
    an oscillator circuit for providing a clock reference signal to a downstream circuit and to said phase comparator circuit as one of said two incoming signals.

5. The video processing circuit of claim 4, further comprising:
said filter circuit for filtering a signal being provided to said oscillator circuit from said phase comparator circuit, said filter circuit being coupled in between said phase comparator circuit and said oscillator circuit, said filter circuit coupled to said decision logic circuit for receiving said filter parameters.

6. The video processing circuit of claim 5, further comprising:
a first divide circuit for dividing a signal provided to said phase comparator circuit from said oscillator circuit, said first divide circuit coupled for receiving a first divisor parameter from said decision logic circuit,
where said decision logic circuit is configured to determine said first divisor parameter for said first divide circuit.

7. The video processing circuit of claim 6, further comprising:
a second divide circuit for dividing a signal provided to said phase comparator circuit from said incoming video circuit, said second divide circuit coupled for receiving a second divisor parameter from said decision logic circuit,
where said decision logic circuit is configured to determine said second divisor parameter for said second divide circuit.

8. The video processing circuit of claim 5, wherein said filter circuit is a low pass filter.

9. The video processing circuit of claim 5, wherein said filter circuit is a lead/lag filter.

10. A method of processing a video signal, said method comprising:
counting a frequency representing a frequency of an incoming video signal;
determining a clock frequency of said incoming video signal;
adjusting parameters of a first signal provided to a phase lock loop circuit, which locks to a signal representing said incoming video signal based on the determined clock frequency; and
providing a second signal by said phase lock loop circuit a process clock frequency for use in processing said incoming video signal, said process clock frequency related to said frequency of said incoming video signal.

11. The method of claim 10, further comprising the step of:
adjusting parameters of said second signal based on the determined clock frequency.

12. The method of claim 11, wherein said first signal is said frequency representing a frequency of said incoming video signal is adjusted by a filter.

13. The method of claim 12, wherein said second signal is an output of a controlled oscillator.

14. The method of claim 11, further comprising the step of:
comparing by said phase lock loop said first and second signals and outputting a result of said comparing;
adjusting said result by a third signal based on said determined clock frequency of said incoming video signal; and
providing said adjusted result to a controlled oscillator.

15. A video processing circuit for processing an incoming video stream, comprising:
an incoming video signal circuit for receiving an incoming video signal; and
a frequency counter circuit for determining a clock frequency of said incoming video signal and determining a video format based on the determined clock frequency, said frequency counter comprises:
a period counter circuit for counting a period representing time between sync signals of said incoming video signal,
a timeout circuit for monitoring elapsed time between successive sync signals and providing a hold signal when a sync signal is detected as missing; and
a latch circuit for holding a signal from said period counter, said latch circuit coupled to and being configured to receive said sync signals, signals from said period counter circuit and signals from said timeout circuit, said latch circuit being reset with a new signal from said period counter whenever a sync signal is received except when said hold signal is received from said timeout circuit.

16. The video processing circuit of claim 15, further comprising:
a phase lock loop circuit for receiving a signal representing the frequency of said incoming video signal from said incoming video signal circuit and providing an output signal related to the frequency of said incoming video signal.

17. The video processing circuit of claim 16, further comprising:
a decision logic circuit coupled to and configured to receive input from said frequency counter circuit, said decision logic circuit configured to determine filter parameters that corresponds to the determined video format.

18. The video processing circuit of claim 17, wherein said decision logic circuit is configured to determine first divider parameters that correspond to the video format.

19. The video processing circuit of claim 18, wherein said decision logic circuit is configured to determine second divider parameters that correspond to the video format.

20. The video processing circuit of claim 16, wherein said phase lock loop circuit further comprises:
an oscillator; and
a filter coupled to and being configured to receive filter parameters input from said decision logic circuit, said filter being configured to process a signal received from said incoming video signal circuit, said filter coupled to and being configured to provide output to said oscillator based on said input from said decision logic circuit.

21. The video processing system of claim 20, wherein said filter is a low pass filter.

22. The video processing system of claim 21, wherein said filter is a lead/lag filter.

23. The video processing system of claim 18, wherein said phase lock loop circuit further comprises:
a first divide circuit, coupled to and being configured to receive input from said oscillator, said first divide circuit coupled to and being configured to receive input about a divider from said decision logic circuit, said first divide circuit coupled to and being configured to provide output to a phase comparator, said first divide circuit being configured to process a signal received from said oscillator based on input from said decision logic circuit and providing a result of said determination to said phase comparator.

* * * * *